United States Patent
Kuriyama

(10) Patent No.: US 6,768,381 B2
(45) Date of Patent: Jul. 27, 2004

(54) SEMICONDUCTOR POWER AMPLIFIER AND MULTISTAGE MONOLITHIC INTEGRATED CIRCUIT

(75) Inventor: Yasuhiko Kuriyama, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 56 days.

(21) Appl. No.: 09/817,216

(22) Filed: Mar. 27, 2001

(65) Prior Publication Data

US 2001/0024141 A1 Sep. 27, 2001

(30) Foreign Application Priority Data

Mar. 27, 2000 (JP) ........................................ 2000-086157

(51) Int. Cl.[7] .............................................. H03F 3/68
(52) U.S. Cl. ...................................... 330/295; 330/302
(58) Field of Search ............................... 330/286, 295, 330/302, 124 R, 53, 84

(56) References Cited

U.S. PATENT DOCUMENTS

| | | | | |
|---|---|---|---|---|
| 3,769,586 A | * | 10/1973 | Shapiro et al. | 455/129 |
| 5,608,353 A | | 3/1997 | Pratt | |
| 5,694,085 A | * | 12/1997 | Walker | 330/295 |
| 5,949,287 A | * | 9/1999 | Kurusu et al. | 330/277 |
| 6,005,442 A | * | 12/1999 | Maeda et al. | 330/295 |
| 6,201,445 B1 | * | 3/2001 | Morimoto et al. | 330/295 |

FOREIGN PATENT DOCUMENTS

| | | |
|---|---|---|
| JP | 10-163772 | 6/1998 |
| JP | 11-251849 | 9/1999 |

* cited by examiner

*Primary Examiner*—Henry Choe
(74) *Attorney, Agent, or Firm*—Oblon, Spivak, McClelland, Maier & Neustadt, P.C.

(57) ABSTRACT

There are disclosed a semiconductor power amplifier and a microwave monolithic integrated circuit which can be reduced in size and cost and which can sufficiently inhibit loop oscillation. The semiconductor power amplifier of the present invention comprises first and second transistors connected in parallel, a capacitor element connected between a signal input terminal and a base terminal of the first transistor, a capacitor element connected between the signal input terminal and a base terminal of the second transistor, and a resistance element connected between the respective base terminals of the first and second transistors. Since the capacitor element and resistance element are disposed, a loop oscillation signal can sufficiently be attenuated on a loop oscillation path. Moreover, in the present embodiment, since miniaturization is possible, MMIC can easily be constituted.

18 Claims, 11 Drawing Sheets

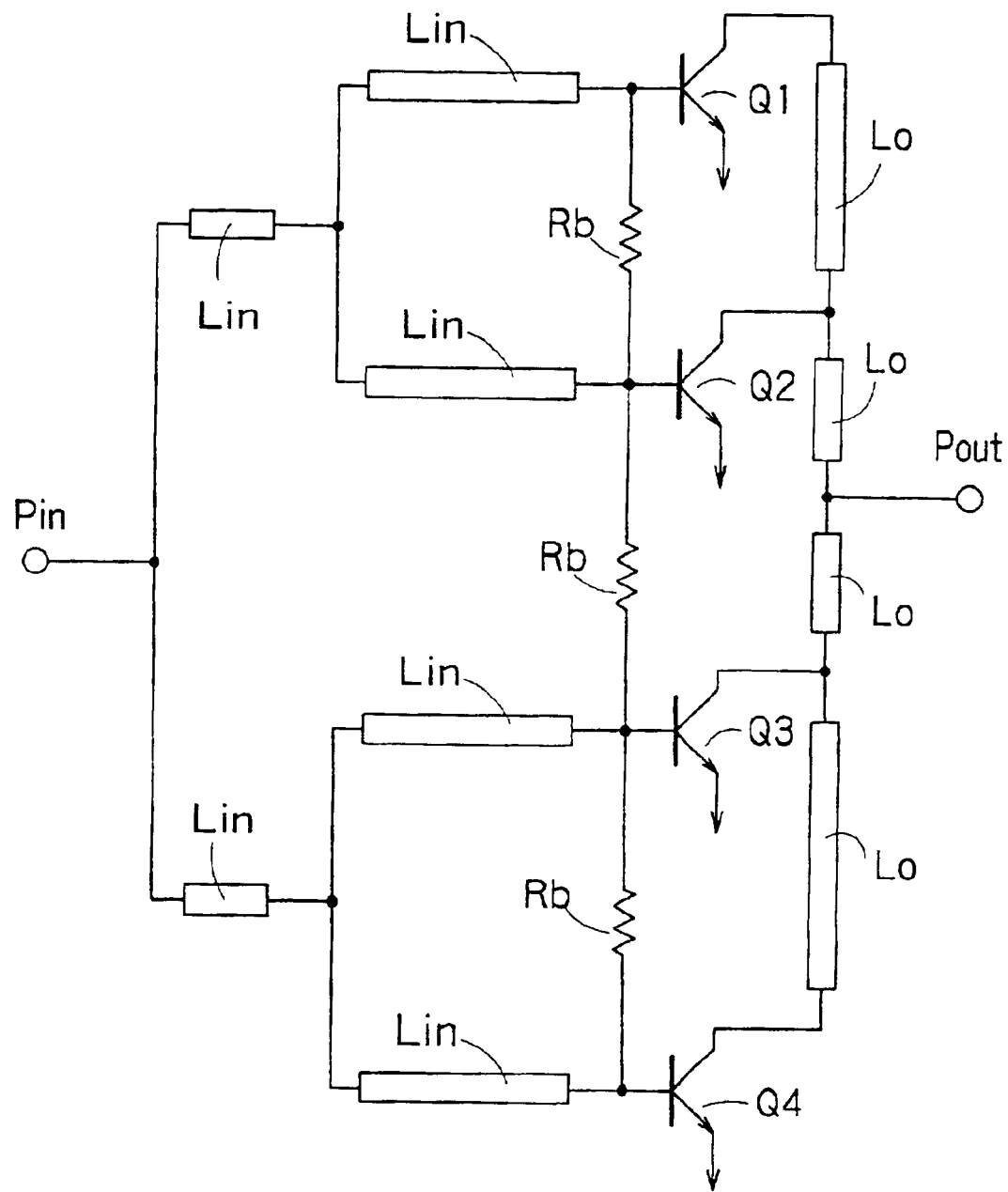
F I G. 3

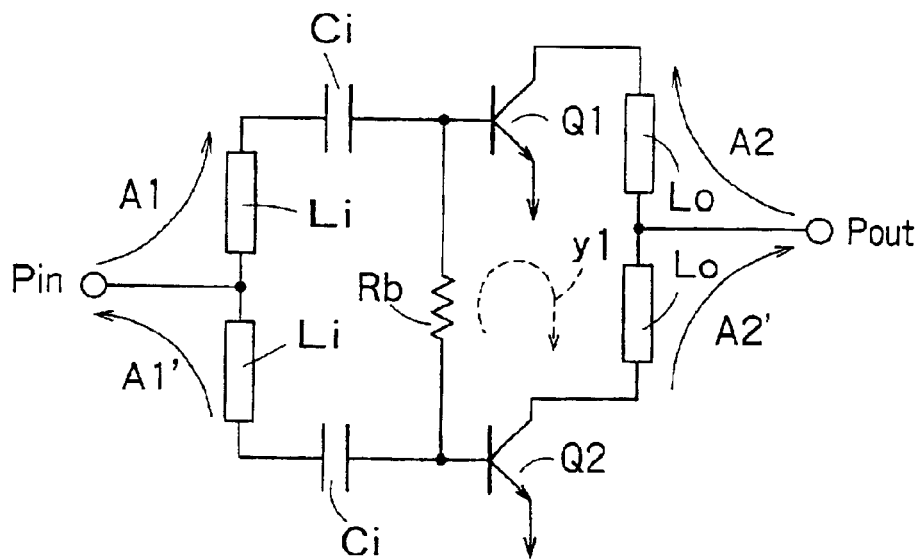
F I G. 4
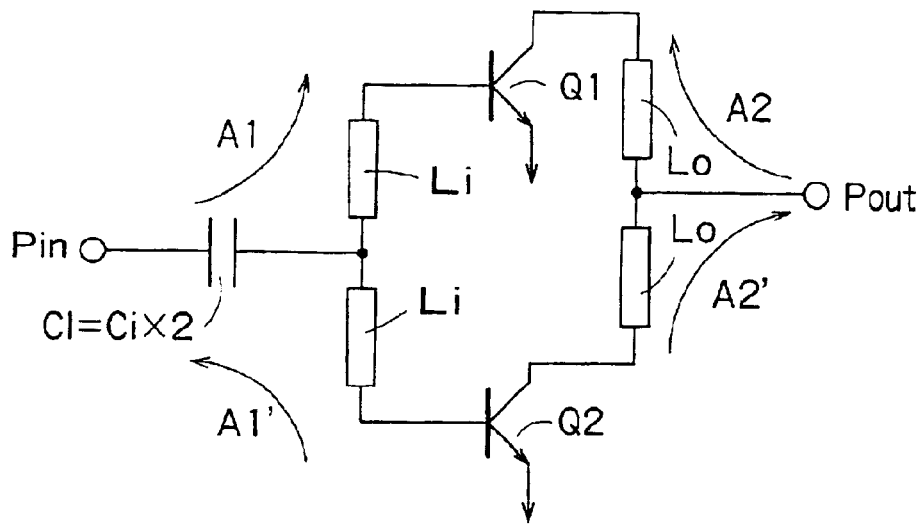
F I G. 5

LOOP GAIN CALCULATION
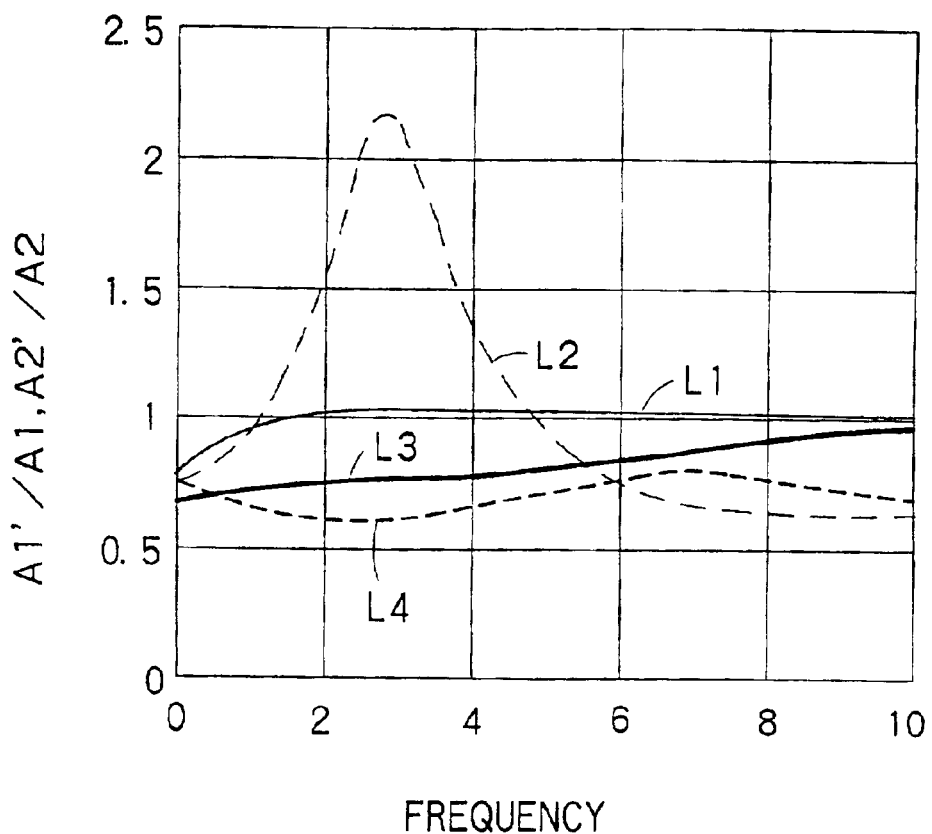
| L1 | ——— | A1'/A1 OF CONVENTIONAL EXAMPLE |
| L2 | - - - - | A2'/A2 OF CONVENTIONAL EXAMPLE |
| L3 | ——— | A1'/A1 OF THE PRESENT INVENTION |
| L4 | - - - - - - | A2'/A2 OF THE PRESENT INVENTION |
F I G. 6

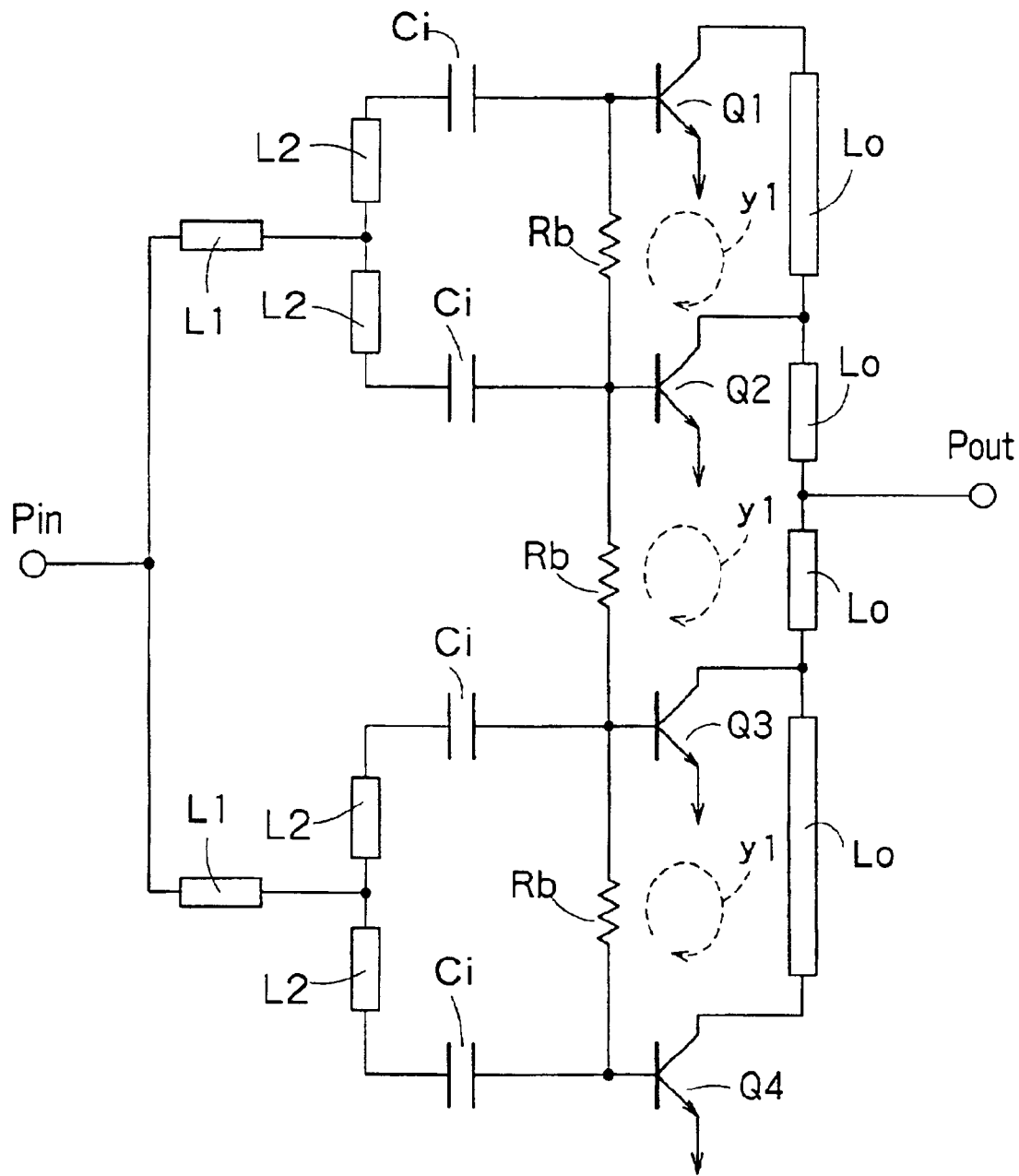
F I G. 8

SEMICONDUCTOR POWER AMPLIFIER AND MULTISTAGE MONOLITHIC INTEGRATED CIRCUIT

CROSS REFERENCE TO RELATED APPLICATIONS

This application claims the priority right under 35 U.S.C. 119 of Japanese Patent Application No. 86157/2000 filed in Japan on Mar. 27, 2000.

BACKGROUND OF THE INVENTION

1. Field of the Invention

The present invention relates to a semiconductor power amplifier and a multistage monolithic integrated circuit which are constituted by connecting a plurality of transistors in parallel to one another and which can obtain a high output current.

2. Related Background Art

A high output transistor having a large output current is constituted by connecting a plurality of transistor units in parallel to one another in an equivalent manner as shown in FIG. 1. When the high output transistor shown in FIG. 1 is formed on a semiconductor substrate, an element size is enlarged. Therefore, a spread of a transverse direction of an input/output wiring region acts as transmission lines Li, Lo in an equivalent manner.

In a high frequency region in which the transmission lines Li, Lo influence electric characteristics, signal propagation of an odd mode occurs by an unbalance between the transistors, and loop oscillation (including a f/2 spurious oscillation) is caused (reference document: MW89-59, page 59 by Research Center of Japanese Society of Electronic Communication).

For example, in a circuit of FIG. 1, loop oscillation occurs in loops shown by dotted lines A and B.

As a technique for preventing such a loop oscillation, as shown in FIGS. 2 and 3, a technique has been proposed in which a balance resistance Rb is connected between output terminals of two transistors adjacent to each other among transistors Q1 to Q4, loss is applied to a loop oscillation path and the loop oscillation is prevented. Since the balance resistance Rb is connected between the output terminals, a signal loss of the loop oscillation path increases, and the loop oscillation can be inhibited.

However, when the balance resistance Rb is added, an area occupied by an input signal synthesis circuit and output signal synthesis circuit is enlarged by the resistance. Therefore, it becomes difficult to form the circuit on a semiconductor chip. The circuit may also be formed on a ceramic substrate or a glass epoxy substrate. In order to reduce a size of an element, however, a high output amplifier is preferably formed on the semiconductor chip to constitute a microwave monolithic integrated circuit (MMIC).

When the loop oscillation is inhibited by a conventional technique in this manner, it is difficult to reduce the size of the element, and cost cannot be lowered.

SUMMARY OF THE INVENTION

The present invention has been developed in consideration of this respect, and an object thereof is to provide a semiconductor power amplifier and a multistage monolithic integrated circuit which can be reduced in size and cost, and loop oscillation can sufficiently be inhibited.

To achieve the aforementioned object, there is provided a semiconductor power amplifier for amplifying a high frequency signal inputted to a signal input terminal by first and second transistors connected in parallel to each other to output the amplified signal via a signal output terminal, the semiconductor power amplifier comprising:
- a first capacitor element connected between the signal input terminal and an input terminal of the first transistor;
- a second capacitor element connected between the signal input terminal and an input terminal of the second transistor; and
- a first impedance element connected between the respective input terminals of the first and second transistors.

According to the present invention, since capacitor elements are connected to the respective input terminals of the first and second transistors, and a resistance element is connected between the respective input terminals of the first and second transistors, loop oscillation (including an f/2 spurious oscillation) by signal propagation of an odd mode of a high output transistor can be prevented.

Moreover, since a bias circuit is separately disposed, a direct current bias can be supplied to the first and second transistors. Even when the capacitor elements are connected to the respective input terminals of the first and second transistors, no particular trouble occurs in an operation.

Furthermore, the present invention is particularly effective for a microwave monolithic integrated circuit using an MOS transistor and a bipolar transistor by a compound semiconductor for use in a high frequency band.

Moreover, there is provided a semiconductor power amplifier for amplifying a signal inputted to a signal input terminal by first and second transistors connected in parallel to each other to output the amplified signal via a signal output terminal, the semiconductor power amplifier comprising:
- a first inductor element and a first capacitor element connected in series between the signal input terminal and an input terminal of the first transistor;
- a second inductor element and a second capacitor element connected in series between the signal input terminal and an input terminal of the second transistor;
- a first impedance element connected between the respective input terminals of the first and second transistors;
- a third inductor element connected between an output terminal of the first transistor and the signal output terminal; and
- a fourth inductor element connected between an output terminal of the second transistor and the signal output terminal.

BRIEF DESCRIPTION OF THE DRAWINGS

FIG. 3 is a conventional circuit diagram showing a modification example of FIG. 2.

FIG. 4 is a circuit diagram of a first embodiment showing a basic constitution of a semiconductor power amplifier according to the present invention.

FIG. 5 is a circuit diagram showing a basic constitution of the conventional semiconductor power amplifier.

FIG. 6 is a diagram showing a calculation result of a loop gain.

FIG. 8 is a circuit diagram of a third embodiment of the semiconductor power amplifier according to the present invention.

DESCRIPTION OF THE PREFERRED EMBODIMENTS

Figure 1:
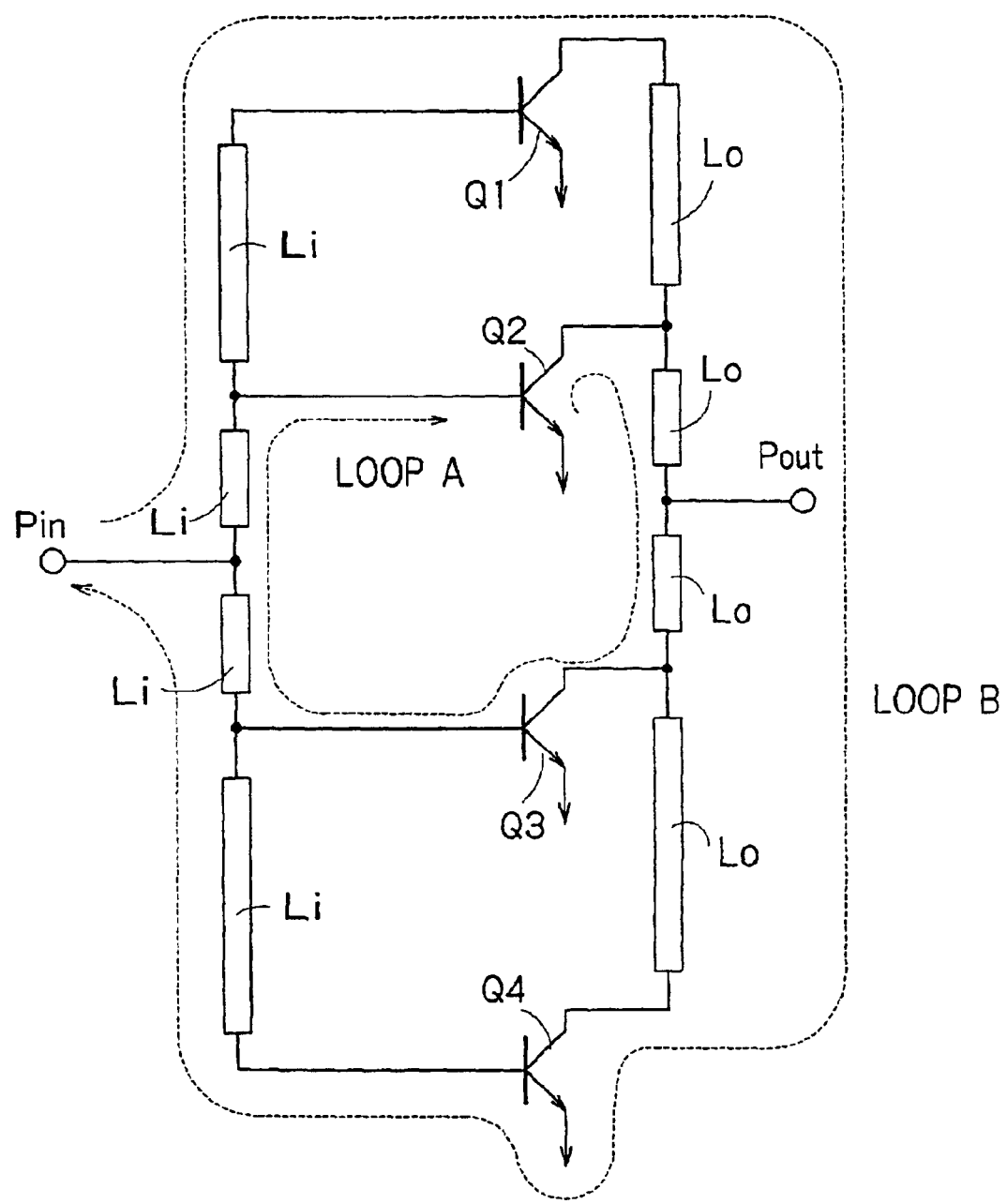
FIG. 1 is a circuit diagram showing a constitution of a conventional example in which a plurality of transistor units are connected in parallel to one another.
Figure 2:
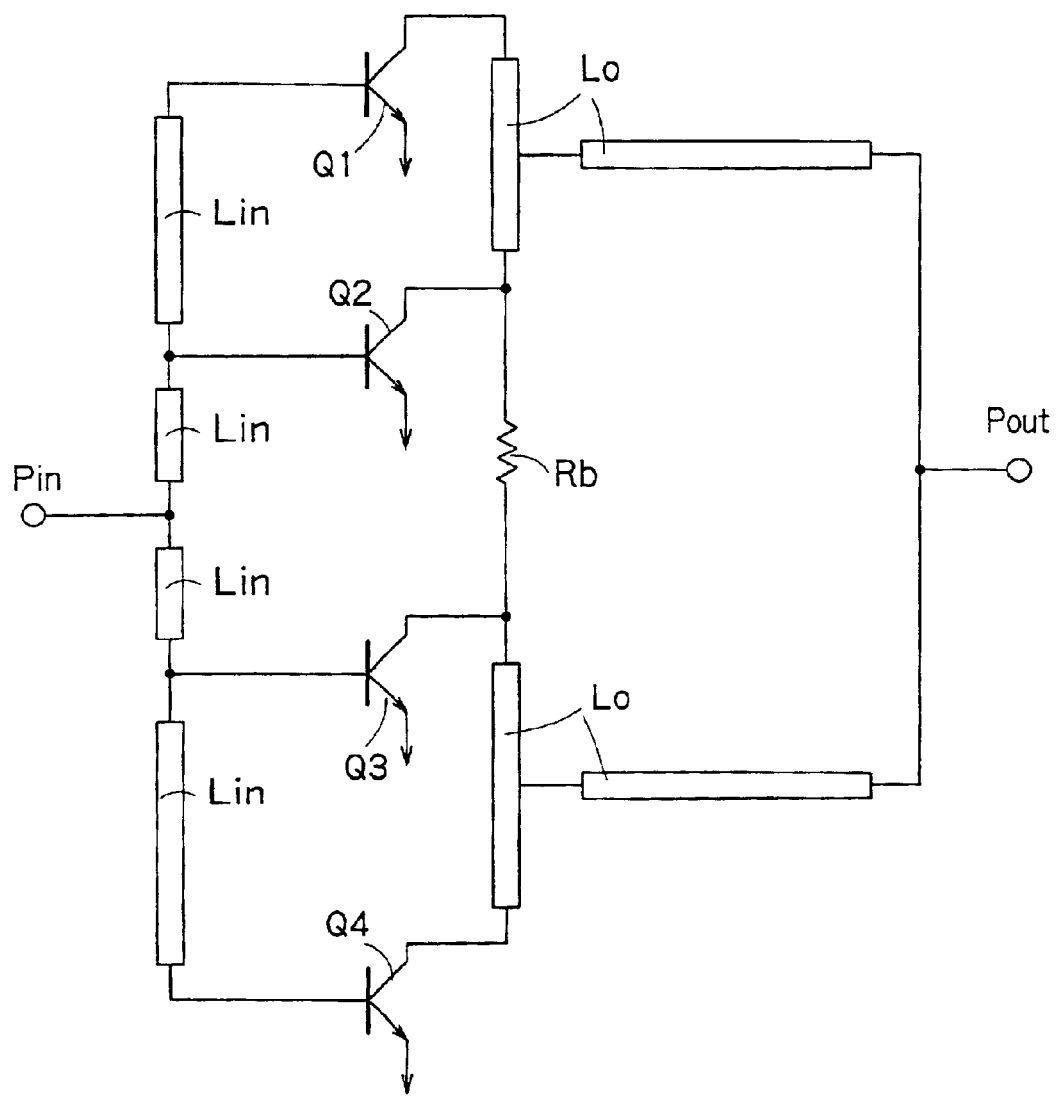
FIG. 2 is a conventional circuit diagram in which a balance resistance is added to a circuit.

A semiconductor power amplifier and a multistage monolithic integrated circuit of the present invention will concretely be described hereinafter with reference to the drawings.

First Embodiment

FIG. 4 is a circuit diagram of a first embodiment showing a basic constitution of a semiconductor power amplifier according to the present invention. The semiconductor power amplifier of FIG. 4 is provided with first and second transistors Q1 and Q2 connected in parallel to each other, a capacitor element (first capacitor element) Ci connected between a signal input terminal Pin and a base terminal of the first transistor Q1, a capacitor element (second capacitor element) Ci connected between the signal input terminal Pin and a base terminal of the second transistor Q2, and a resistance element (first impedance element) Rb connected between the respective base terminals of the first and second transistors Q1 and Q2.

When a high frequency signal is inputted to the semiconductor power amplifier of FIG. 4, the semiconductor power amplifier shown in FIG. 4 is equivalent to a circuit in which inductor elements Li, Lo are connected between the capacitor element Ci and the signal input terminal Pin, and between collector terminals of the first and second transistors Q1 and Q2.

The transistors Q1 and Q2 of FIG. 4 are a heterojunction bipolar transistor, for example, of InGaP/GaAs, and a multiemitter transistor including 16 pieces of transistor units each having an emitter size of 4×30 $\mu$m.

Additionally, the number and size of the transistor units constituting the multi-emitter transistor are not particularly limited. Moreover, the transistor does not have to be necessarily formed of a compound semiconductor.

Each inductance of the equivalent inductor elements Li, Lo is 0.1 nH in a line with a wiring length of 300 $\mu$m, a capacitance of the capacitor element Ci is 5 pF, and a resistance value of the resistance element Rb is 5 $\Omega$.

FIG. 5 is a circuit diagram showing a basic constitution of the conventional semiconductor power amplifier. As obvious in comparison of FIG. 4 with FIG. 5, different from the conventional circuit shown in FIG. 5, the circuit of FIG. 4 includes two capacitor elements Ci, and resistance element Rb.

Both circuits shown in FIGS. 4 and 5 have the same characteristics in even mode propagation for operating in parallel, and have completely separate characteristics in odd mode propagation in which loop oscillation is caused.

In the circuit of FIG. 4, since flow of a loop oscillation signal is cut by two capacitor elements Ci, a loop oscillation path shown by a dotted arrow y1 is obtained. However, since the resistance element Rb exists on the path, the signal can sufficiently be attenuated by the resistance element Rb; as a result, the loop oscillation does not occur.

FIG. 6 is a diagram showing a calculation result of a loop gain, and shows a state that a ratio of an odd mode input A1 (output side A2) to an odd mode output A1' (output side A2') of a signal flow indicating a target for loop oscillation by frequency changes (reference document: MW89-59, page 59 by Research Center of Japanese Society of Electronic Communication).

When this ratio exceeds 1, the loop oscillation is possibly caused. In the conventional circuit shown by curves L1, L2, the ratio A1'/A1 exceeds "1" at 2 GHz or more, and the ratio A2'/A2 exceeds "1" in the vicinity of 1 to 5 GHz. In the circuit of the present embodiment, however, the ratio does not exceed "1", and there is no possibility that the loop oscillation is caused. Moreover, in a structure of the present embodiment, the capacitor element C1 of an input stage shown in FIG. 5 is divided into two capacitor elements Ci as shown in FIG. 4. However, since the capacity value of each capacitor element Ci becomes ½, the area formed by the capacitor element itself hardly changes.

In the first embodiment, since the capacitor elements Ci are connected to the respective base terminals of the transistors Q1 and Q2 connected in parallel to each other, and the resistance element Rb is connected between the respective base terminals in this manner, the loop oscillation signal can sufficiently be attenuated on the loop oscillation path. Moreover, since the circuit can be miniaturized in the present embodiment, it is easy to constitute MMIC.

Second Embodiment

A second embodiment is the same as the first embodiment in a basic circuit constitution, but is characterized in that the number of transistor connection stages is increased.

Figure 7:
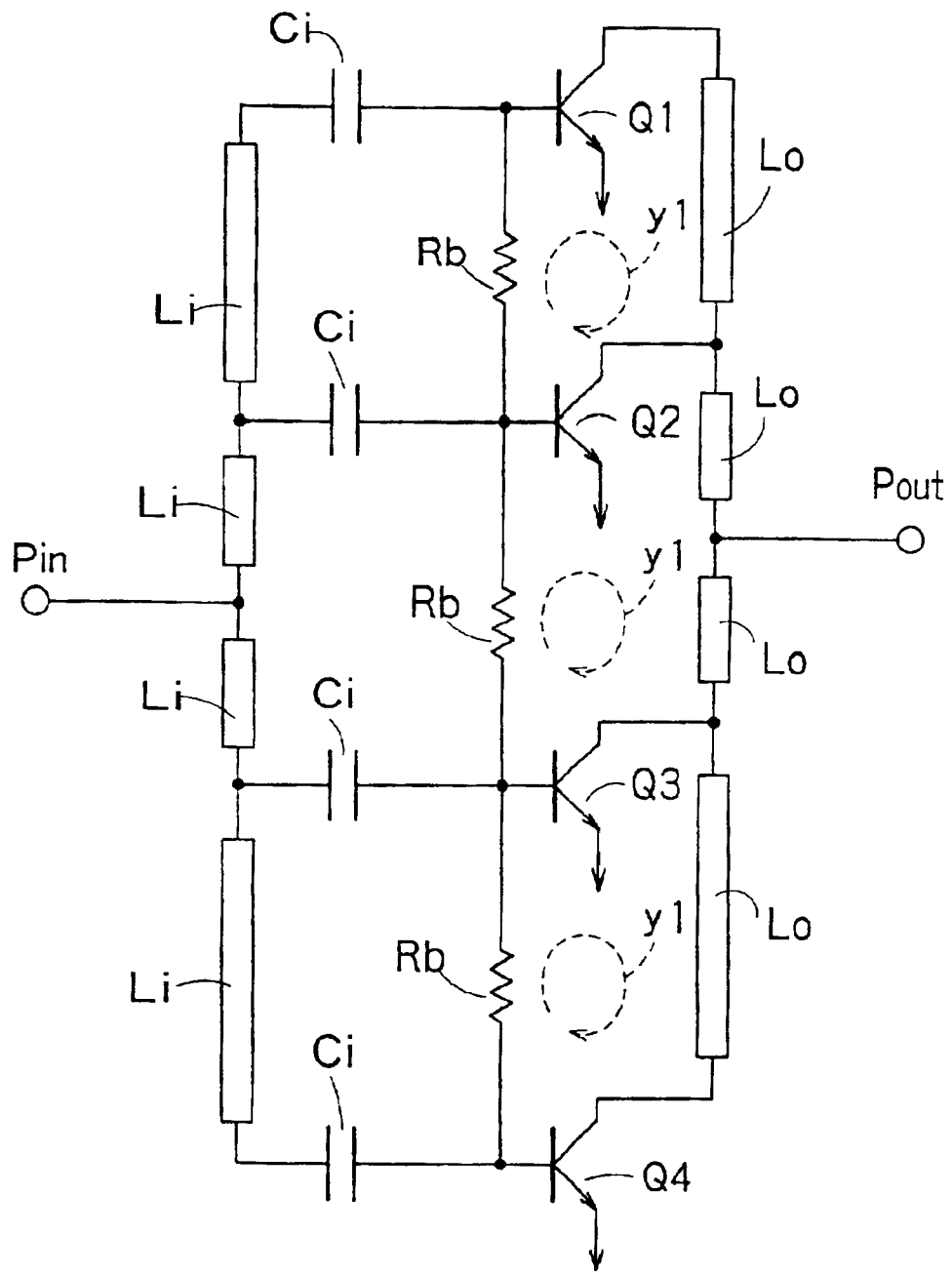
FIG. 7 is a circuit diagram of a second embodiment of the semiconductor power amplifier according to the present invention.

FIG. 7 is a circuit diagram of a second embodiment of the semiconductor power amplifier according to the present invention. The amplifier of FIG. 7 is constituted by connecting a plurality of circuits similar to the circuit of FIG. 4 in parallel to one another. Concretely, the capacitor elements Ci are connected to the respective base terminals of four transistors Q1 to Q4, and the resistance element Rb is connected between the base terminals of the transistors adjacent to each other.

In the circuit of FIG. 7, inductor elements L11, L12 connected to the signal input terminal Pin correspond to first and second inductor elements (fifth and sixth inductor elements), an inductor element L13 connected to the inductor element L11 corresponds to a third inductor element (seventh inductor element), and an inductor element L14 connected to the inductor element L12 corresponds to a fourth inductor element (eighth inductor element).

There are provided with the capacitor element Ci and resistance element Rb are connected as shown in FIG. 7, a loop oscillation path shown by a dotted arrow y1 of FIG. 7. Since the resistance element Rb exists on the loop oscillation path, the signal can sufficiently be attenuated, and no loop oscillation occurs.

Third Embodiment

A third embodiment is a modification example of the second embodiment, and is characterized in that the signal is transmitted to all transistor units at the same phase.

FIG. 8 is a circuit diagram of the third embodiment of the semiconductor power amplifier according to the present invention. The circuit of FIG. 8 is constituted by connecting two sets of circuits similar to the circuit of FIG. 4 in parallel to each other, and connecting the resistance element Rb between the base terminals of the transistor of each set.

In the circuit of FIG. 8, inductor elements L21, L22 connected to the signal input terminal Pin correspond to first and second inductor elements (fifth and sixth inductor elements), inductor elements L23, L24 connected to the inductor element L21 correspond to third and fourth inductor elements (seventh and eighth inductor elements), and inductor elements L25, L26 connected to the inductor element L22 correspond to fifth and sixth inductor elements (ninth and tenth inductor elements).

In the constitution of FIG. 8, different from FIG. 7, the same phase signal can be transmitted to each set. Particularly, when the high frequency signal is amplified, influence of an inductor component is easily exerted. Therefore, when the same phase signal is transmitted, characteristics can be stabilized.

Additionally, in the connection of FIG. 8, a distance between the input terminal and the capacitor element becomes slightly longer than the distance in the connection of FIG. 7. However, a distance deviation can be reduced by devising drawing of a wiring pattern.

Fourth Embodiment

In the semiconductor power amplifier shown in the first to third embodiments, since the capacitor element is connected to the base terminal of each transistor, a direct current bias cannot be applied to each transistor. To solve the problem, in a fourth embodiment, a circuit for supplying the direct current bias to the transistor of the first to third embodiments is added.

Figure 9:
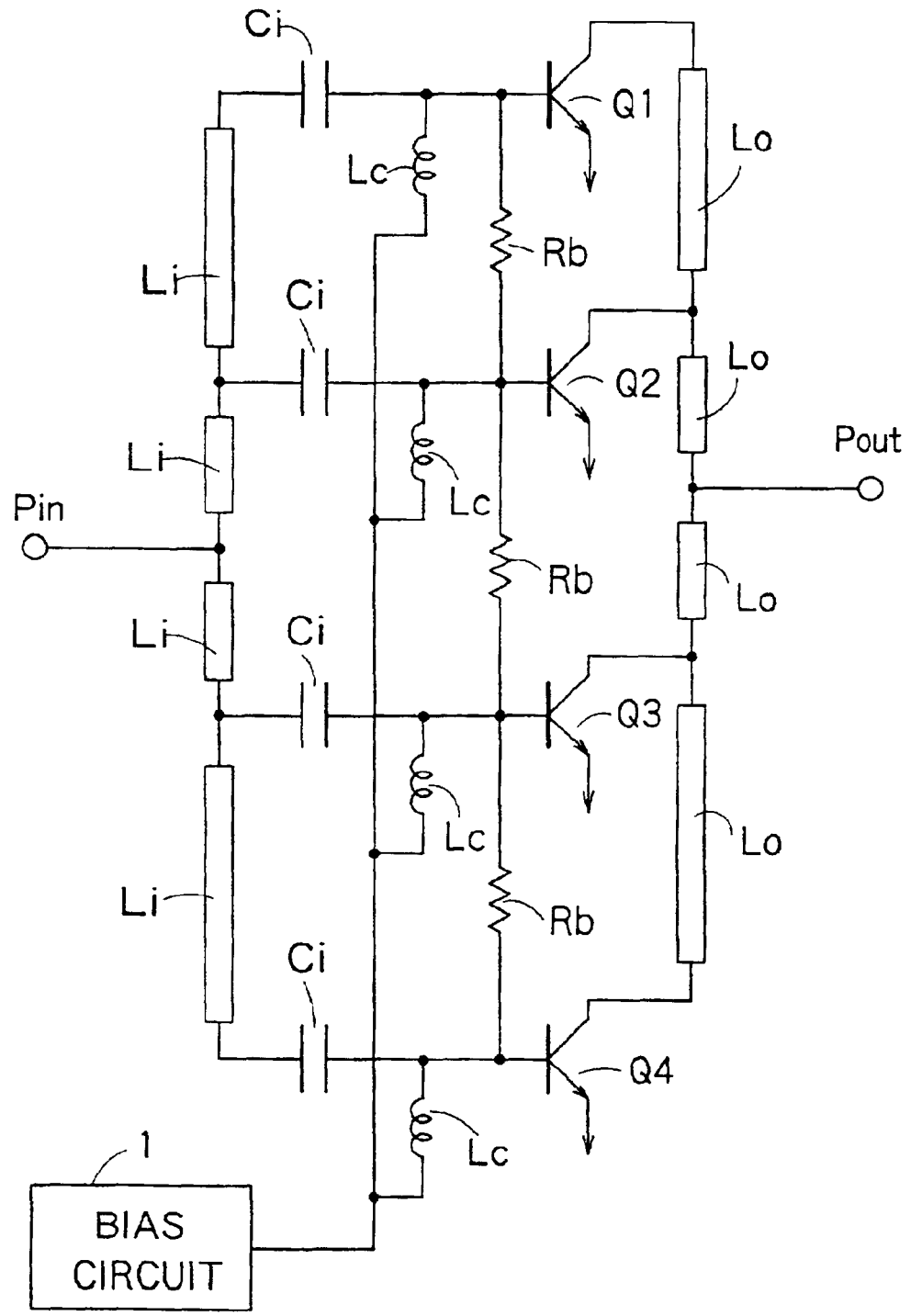
FIG. 9 is a circuit diagram of a fourth embodiment of the semiconductor power amplifier according to the present invention.

FIG. 9 is a circuit diagram of the fourth embodiment of the semiconductor power amplifier according to the present invention. The circuit of FIG. 9 is different from the circuit of FIG. 7 in that a bias circuit 1 is disposed and an inductor element Lc is connected between the base terminal of each of the transistors Q1 to Q4 and the bias circuit 1. When the inductor element Lc is disposed, the base terminal of each of the transistors Q1 to Q4 is open at a high frequency, and characteristics during operation at the high frequency are stabilized.

When the bias circuit 1 and inductor element Lc are disposed as shown in FIG. 9, the direct current bias can be supplied to each of the transistors Q1 to Q4.

However, when the inductor element Lc is formed on the substrate, since a chip occupying area increases, it is possible to miniaturize the chip. Then, FIG. 10 shows an example in which a resistance element Rc is used instead of the inductor element Lc.

Figure 10:
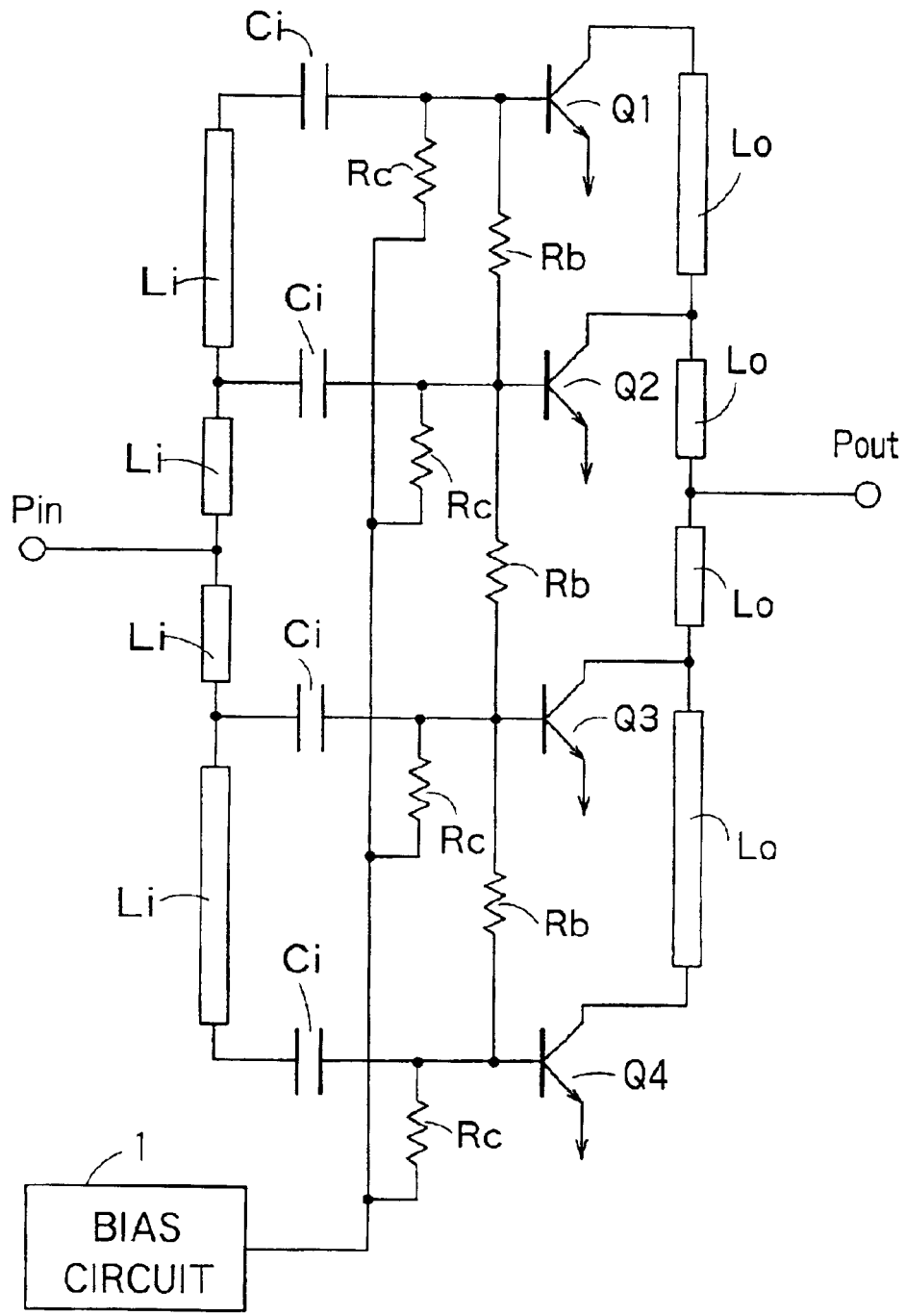
FIG. 10 is a circuit diagram showing an example in which a resistance element is used instead of an inductor element of FIG. 9.

Since the resistance element Rc of FIG. 10 has to be open at the high frequency, the resistance value needs to be increased. When the resistance value is increased, the chip occupying area is reduced. Accordingly, the semiconductor power amplifier is miniaturized, thereby realizing a MMIC.

Figure 11:
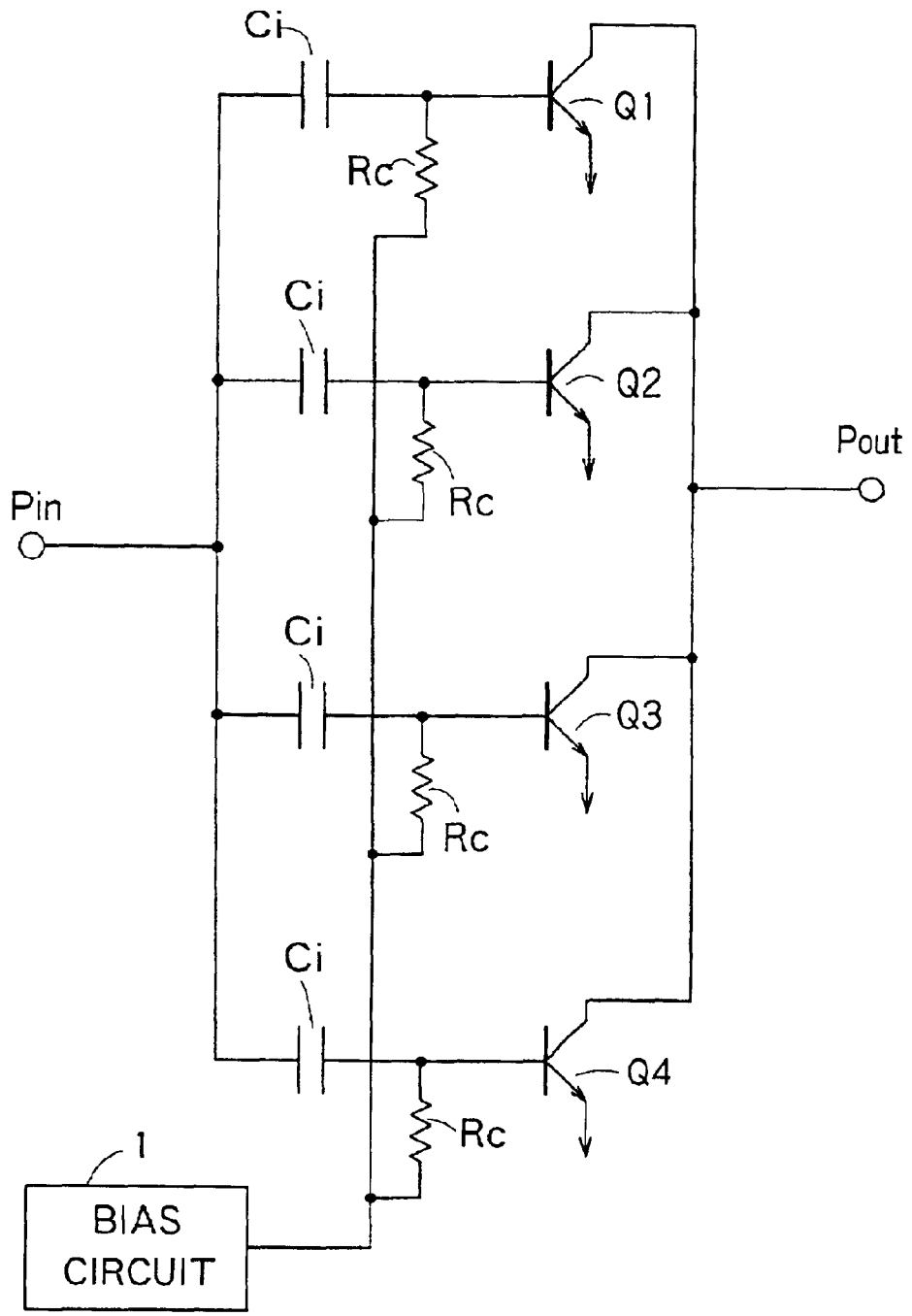
FIG. 11 is a circuit diagram of a power amplifier disclosed in U.S. Pat. No. 5,608,353.

Incidentally, FIG. 11 shows a power amplifier disclosed in U.S. Pat. No. 5,608,353. In comparison of FIG. 10 with FIG. 11, the drawings are different from each other only in that the resistance element Rb is or is not connected between the base terminals of the transistors adjacent to each other.

In the circuit of FIG. 11, the resistance element Rc is connected to the base terminal of each transistor for the purpose of enhancing fracture resistance, and the resistance value of the resistance element has to be large. When it is assumed that the resistance element Rb similar to that of FIG. 10 is connected to the circuit of FIG. 11 formed with such a purpose, a potential difference between the transistors adjacent to each other is reduced, and the original purpose of the circuit of FIG. 11, in which breakdown-resisting performance can be improved.

That is, even when the circuit of FIG. 11 is known, to achieve the purpose of enhancing the breakdown-resisting performance, it cannot be considered that the resistance element Rb similar to that of FIG. 10 is added to the circuit of FIG. 11. Therefore, it is never easy to suppose the circuit of the present embodiment shown in FIG. 10 from the conventional circuit of FIG. 11.

Figure 12:
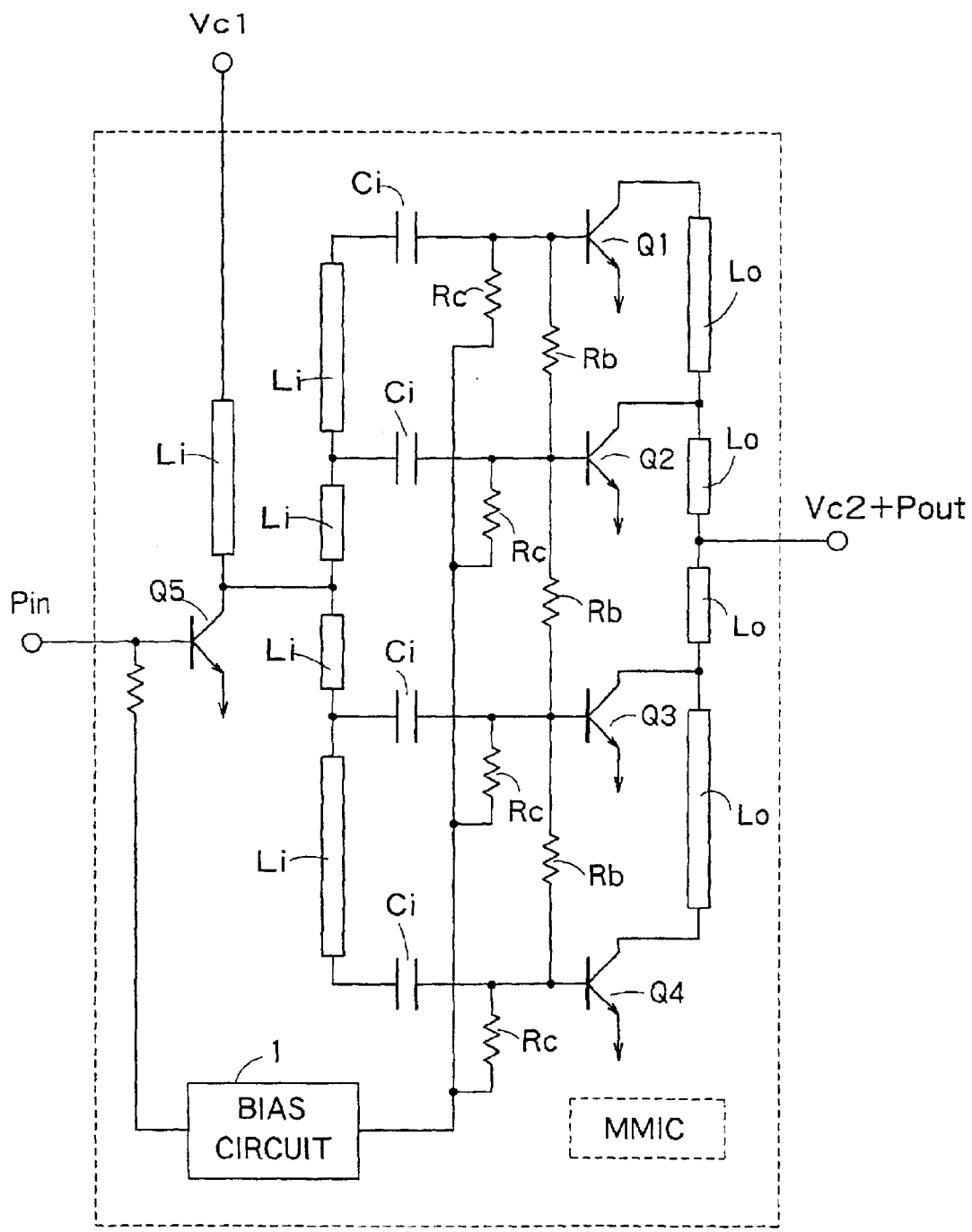
FIG. 12 is a circuit diagram of an MMIC amplifier with a two-stage constitution including the semiconductor power amplifier of FIG. 10.

FIG. 12 is a circuit diagram of an MMIC amplifier with a two-stage constitution including the semiconductor power amplifier of FIG. 10. The signal input terminal Pin is connected to the base terminal of the first-stage transistor Q5, and the collector terminal of the transistor Q5 is connected to the semiconductor power amplifier having the constitution similar to that of FIG. 10.

In the circuit of FIG. 12, the capacitor element Ci is used as an inter-stage matching circuit for matching the first-stage transistor Q5 with the subsequent-stage transistors Q1 to Q4.

In the aforementioned respective embodiments, an example for using the bipolar transistor to constitute the semiconductor power amplifier has been described, but MOS and BiCMOS transistors may be used to constitute the semiconductor power amplifier. Moreover, the number of transistors connected in parallel is not particularly limited.

What is claimed is:

1. A semiconductor power amplifier for amplifying a high frequency signal inputted to a signal input terminal by first and second transistors connected in parallel to each other to output the amplified signal via a signal output terminal, said semiconductor power amplifier comprising:

a first capacitor element connected between said signal input terminal and an input terminal of said first transistor;

a second capacitor element connected between said signal input terminal and an input terminal of said second transistor; and a resistor, one end of which is connected directly to a connection path between the first capacitor and the input terminal of said first transistor, and another end of which is connected directly to a connection path between the second capacitor and the input terminal of said second transistor.

2. A semiconductor power amplifier for amplifying a signal inputted to a signal input terminal by first and second transistors connected in parallel to each other to output the amplified signal via a signal output terminal, said semiconductor power amplifier comprising:

a first inductor element and a first capacitor element connected in series between said signal input terminal and an input terminal of said first transistor;

a second inductor element and a second capacitor element connected in series between said signal input terminal and an input terminal of said second transistor;

a first impedance element connected between the respective input terminals of said first and second transistors;

a third inductor element connected between an output terminal of said first transistor and said signal output terminal; and a fourth inductor element connected between an output terminal of said second transistor and said signal output terminal.

3. A semiconductor power amplifier for amplifying a high frequency signal inputted to a signal input terminal by first and second transistors connected in parallel to each other to output the amplified signal via a signal output terminal, said semiconductor power amplifier comprising:

a first power amplifying section comprising:
  a first capacitor element connected between said signal input terminal and an input terminal of said first transistor;
  a second capacitor element connected between said signal input terminal and an input terminal of said second transistor; and
  a first impedance element, one end of which is connected to the input terminal of said first transistor, and the other end of which is connected to the input terminal of said second transistor;
a second power amplifying section disposed separately from said first power amplifying section, said second power amplifying section comprising third and fourth transistors, third and fourth capacitor elements, and a second impedance element; and
a third impedance element connected between said first impedance element and said second impedance element,
wherein respective input terminals of said first and second power amplifying sections are connected to said signal input terminal via first and second inductor elements.

4. The semiconductor power amplifier according to claim 3, further comprising:
  a third inductor element whose one end is connected to said first capacitor element and whose other end is connected to said first inductor element and said second capacitor element; and
  a fourth inductor element whose end is connected to said second inductor element and said third capacitor element and whose other end is connected to said fourth capacitor element.

5. The semiconductor power amplifier according to claim 3, further comprising:
  a third inductor element whose one end is connected to said first capacitor element and whose other end is connected to said first inductor element;
  a fourth inductor element whose one end is connected to said first inductor element and whose other end is connected to said second capacitor element;
  a fifth inductor element whose one end is connected to said third capacitor and whose other end is connected to said second inductor element; and
  a sixth inductor element whose one end is connected to said second inductor element and whose other end is connected to said fourth capacitor element.

6. The semiconductor power amplifier according to claim 2, further comprising:
  a first power amplifying section comprising said first and second transistors, said first and second capacitor elements, and said first impedance element;
  a second power amplifying section disposed separately from said first power amplifying section, said second power amplifying section comprising third and fourth transistors, third and fourth capacitor elements, and a second impedance element; and
  a third impedance element connected between said first impedance element and said second impedance element,
  wherein respective input terminals of said first and second power amplifying sections are connected to said signal input terminals via fifth and sixth inductor elements.

7. The semiconductor power amplifier according to claim 6, further comprising:
  a seventh inductor element whose one end is connected to said first capacitor element and whose other end is connected to said fifth inductor element and said second capacitor element; and
  an eighth inductor element whose one end is connected to said sixth inductor element and said third capacitor element and whose other end is connected to said fourth capacitor element.

8. The semiconductor power amplifier according to claim 6, further comprising:
  a seventh inductor element whose one end is connected to said first capacitor element and whose other end is connected to said fifth inductor element;
  an eighth inductor element whose one end is connected to said fifth inductor element and whose other end is connected to said second capacitor element;
  a ninth inductor element whose one end is connected to said third capacitor element and whose other end is connected to said sixth inductor element; and
  a tenth inductor element whose one end is connected to said sixth inductor element, and whose other end is connected to said fourth capacitor element.

9. The semiconductor power amplifier according to claim 1, further comprising a bias circuit for supplying a direct current bias voltage to the respective input terminals of said first and second transistors.

10. The semiconductor power amplifier according to claim 2, further comprising a bias circuit for supplying a direct current bias voltage to the respective input terminals of said first and second transistors.

11. The semiconductor power amplifier according to claim 9, further comprising a plurality of impedance elements or inductor elements connected between the respective input terminals of said first and second transistors and an output terminal of said bias circuit.

12. The semiconductor power amplifier according to claim 10, further comprising a plurality of impedance elements or inductor elements connected between the respective input terminals of said first and second transistors and an output terminal of said bias circuit.

13. A multistage monolithic integrated circuit comprising:
  a plurality of amplifiers connected in cascade,
  wherein a last-stage amplifier of these amplifiers includes a semiconductor power amplifier for amplifying a high frequency signal inputted to a signal input terminal by first and second transistors connected in parallel to each other to output the amplified signal via a signal output terminal, said semiconductor power amplifier comprising:
    a first capacitor element connected between said signal input terminal and an input terminal of said first transistor;
    a second capacitor element connected between said signal input terminal and an input terminal of said second transistor; and
    a first impedance element, one end of which is connected to the input terminal of said first transistor, and the other end of which is connected to the input terminal of said second transistor.

14. The semiconductor power amplifier according to claim 13, wherein a microwave signal is inputted to a signal input terminal of said last-stage amplifier.

15. The semiconductor power amplifier according to claim 13, wherein said first and second transistors are field-effect transistors by compound semiconductors or bipolar transistors by the compound semiconductors.

16. A multistage monolithic integrated circuit comprising:
  a plurality of amplifiers connected in cascade, wherein a last-stage amplifier of these amplifiers is constituted of the semiconductor power amplifier according to claim 2.

17. The semiconductor power amplifier according to claim 16, wherein a microwave signal is inputted to a signal input terminal of said last-stage amplifier.

18. The semiconductor power amplifier according to claim 16, wherein said first and second transistors are field-effect transistors by compound semiconductors or bipolar transistors by the compound semiconductors.

* * * * *